(12) United States Patent
Aubel et al.

(10) Patent No.: US 8,153,524 B2
(45) Date of Patent: Apr. 10, 2012

(54) PROVIDING SUPERIOR ELECTROMIGRATION PERFORMANCE AND REDUCING DETERIORATION OF SENSITIVE LOW-K DIELECTRICS IN METALLIZATION SYSTEMS OF SEMICONDUCTOR DEVICES

(75) Inventors: Oliver Aubel, Dresden (DE); Joerg Hohage, Dresden (DE); Frank Feustel, Dresden (DE); Axel Preusse, Radebeul (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 12/711,373

(22) Filed: Feb. 24, 2010

(65) Prior Publication Data

US 2010/0221911 A1 Sep. 2, 2010

(30) Foreign Application Priority Data

Feb. 27, 2009 (DE) .......................... 10 2009 010 844

(51) Int. Cl.
*H01L 21/44* (2006.01)
(52) U.S. Cl. ................. 438/687; 438/906; 257/E21.575
(58) Field of Classification Search .................. 438/687, 438/906; 257/E21.575
See application file for complete search history.

(56) References Cited

U.S. PATENT DOCUMENTS

| 6,259,160 B1 | 7/2001 | Lopatin et al. ................ 257/762 |
| 6,869,878 B1 | 3/2005 | Adem et al. .................. 438/687 |
| 7,268,074 B2* | 9/2007 | Yakobson et al. ............ 438/653 |
| 7,309,658 B2* | 12/2007 | Lazovsky et al. ............. 438/754 |
| 7,678,699 B2* | 3/2010 | Hohage et al. ................ 438/687 |
| 2008/0176396 A1* | 7/2008 | Futase et al. .................. 438/652 |
| 2010/0093168 A1* | 4/2010 | Naik ............................. 438/618 |

FOREIGN PATENT DOCUMENTS

| DE | 102005035740 A1 | 2/2007 |
| DE | 102005057057 A1 | 5/2007 |

OTHER PUBLICATIONS

Translation of Official Communication from German Patent Office for German Patent Application No. 10 2009 010 844.0 dated Jan. 21, 2010.

* cited by examiner

*Primary Examiner* — Walter L Lindsay, Jr.
*Assistant Examiner* — Ron Pompey
(74) *Attorney, Agent, or Firm* — Williams, Morgan & Amerson

(57) ABSTRACT

During the formation of complex metallization systems, a conductive cap layer may be formed on a copper-containing metal region in order to enhance the electromigration behavior without negatively affecting the overall conductivity. At the same time, a thermo chemical treatment may be performed to provide superior surface conditions of the sensitive dielectric material and also to suppress carbon depletion, which may conventionally result in a significant variability of material characteristics of sensitive ULK materials.

20 Claims, 2 Drawing Sheets

PROVIDING SUPERIOR ELECTROMIGRATION PERFORMANCE AND REDUCING DETERIORATION OF SENSITIVE LOW-K DIELECTRICS IN METALLIZATION SYSTEMS OF SEMICONDUCTOR DEVICES

BACKGROUND OF THE INVENTION

1. Field of the Invention

Generally, the present disclosure relates to microstructures, such as advanced integrated circuits, and, more particularly, to metallization systems comprising sophisticated dielectric and conductive materials.

2. Description of the Related Art

In the fabrication of modern microstructures, such as integrated circuits, there is a continuous drive to steadily reduce the feature sizes of microstructure elements, thereby enhancing the functionality of these structures. For instance, in modern integrated circuits, minimum feature sizes, such as the channel length of field effect transistors, have reached the deep sub-micron range, thereby increasing performance of these circuits in terms of speed and/or power consumption and/or diversity of functions. As the size of individual circuit elements is reduced with every new circuit generation, thereby improving, for example, the switching speed of the transistor elements, the available floor space for interconnect lines electrically connecting the individual circuit elements is also decreased. Consequently, the dimensions of these interconnect lines are also reduced to compensate for a reduced amount of available floor space and for an increased number of circuit elements provided per unit die area, as typically the number of interconnections required increases more rapidly than the number of circuit elements. Thus, a plurality of stacked "wiring" layers, also referred to as metallization layers, is usually provided, wherein individual metal lines of one metallization layer are connected to individual metal lines of an overlying or underlying metallization layer by so-called vias. Despite the provision of a plurality of metallization layers, reduced dimensions of the interconnect lines are necessary to comply with the enormous complexity of, for instance, modern CPUs, memory chips, ASICs (application specific ICs) and the like.

Advanced integrated circuits, including transistor elements having a critical dimension of 0.05 µm and even less, may, therefore, typically be operated at significantly increased current densities of up to several kA per cm² in the individual interconnect structures, despite the provision of a relatively large number of metallization layers, owing to the increased number of circuit elements per unit area. Consequently, well-established materials, such as aluminum, are being replaced by copper and copper alloys, i.e., materials with significantly lower electrical resistivity and improved resistance to electromigration even at considerably higher current densities compared to aluminum. The introduction of copper into the fabrication of microstructures and integrated circuits comes along with a plurality of severe problems residing in copper's characteristic to readily diffuse in silicon dioxide and a plurality of low-k dielectric materials, which are typically used in combination with copper in order to reduce the parasitic capacitance within complex metallization layers. In order to provide the necessary adhesion and to avoid the undesired diffusion of copper atoms into sensitive device regions, it is, therefore, usually necessary to provide a barrier layer between the copper and the dielectric material in which the copper-based interconnect structures are embedded. Although silicon nitride is a dielectric material that effectively prevents the diffusion of copper atoms, selecting silicon nitride as an interlayer dielectric material is less than desirable, since silicon nitride exhibits a moderately high permittivity, thereby increasing the parasitic capacitance of neighboring copper lines, which may result in non-tolerable signal propagation delays. Hence, a thin conductive barrier layer that also imparts the required mechanical stability to the copper is usually formed so as to separate the bulk copper from the surrounding dielectric material, thereby reducing copper diffusion into the dielectric materials and also reducing the diffusion of unwanted species, such as oxygen, fluorine and the like, into the copper. Furthermore, the conductive barrier layers may also form strong interfaces with the copper, thereby reducing the probability for inducing significant material migration at the interface, which is typically a critical region in view of increased diffusion paths that may facilitate current induced material diffusion. Currently, tantalum, titanium, tungsten and their compounds with nitrogen and silicon and the like are preferred candidates for a conductive barrier layer, wherein the barrier layer may comprise two or more sub-layers of different composition so as to meet the requirements in terms of diffusion suppressing and adhesion properties.

Another characteristic of copper significantly distinguishing it from aluminum is the fact that copper may not be readily deposited in larger amounts by chemical and physical vapor deposition techniques, thereby requiring a process strategy that is commonly referred to as the damascene or inlaid technique. In the damascene process, first a dielectric layer is formed which is then patterned to include trenches and/or vias which are subsequently filled with copper, wherein, as previously noted, prior to filling in the copper, a conductive barrier layer is formed on sidewalls of the trenches and vias. The deposition of the bulk copper material into the trenches and vias is usually accomplished by wet chemical deposition processes, such as electroplating and electroless plating, thereby requiring the reliable filling of vias with an aspect ratio of 5 and more with a diameter of 0.3 µm or even less in combination with trenches having a width ranging from 0.1 µm to several µm. Electrochemical deposition processes for copper are well established in the field of electronic circuit board fabrication. However, for the dimensions of the metal regions in semiconductor devices, the void-free filling of high aspect ratio vias is an extremely complex and challenging task, wherein the characteristics of the finally obtained copper-based interconnect structure significantly depend on process parameters, materials and geometry of the structure of interest. Since the geometry of interconnect structures is substantially determined by the design requirements and may, therefore, not be significantly altered for a given microstructure, it is of great importance to estimate and control the impact of materials, such as conductive and nonconductive barrier layers, the dielectric materials and the like, and their mutual interaction, on the characteristics of the interconnect structure as a whole so as to insure both high yield and the required product reliability. In particular, it is important to identify, monitor and reduce degradation and failure mechanisms in metallization systems for various configurations so as to maintain device reliability for every new device generation or technology node.

Accordingly, a great deal of effort is being made in investigating the degradation of copper interconnects, especially in combination with low-k dielectric materials or ultra low-k (ULK) materials having a relative permittivity of 3.0 or even less, in order to find new materials and process strategies for forming copper-based lines and vias with a low overall permittivity and superior reliability.

One failure mechanism which is believed to significantly contribute to a premature device failure is the electromigration-induced material transport, particularly along an interface formed between the copper and a dielectric cap layer, which may be provided after filling in the copper material in the trenches and via openings, the side walls of which are coated by the conductive barrier materials. In addition to maintaining copper integrity, the dielectric cap layer may usually act as an etch stop layer during the formation of the via openings in the interlayer dielectric. Frequently used materials are, for example, silicon nitride and nitrogen-containing silicon carbide, which exhibit a moderately high etch selectivity to typically employed interlayer dielectrics, such as a plurality of low-k dielectric materials, and also suppress the diffusion of copper onto the interlayer dielectric. Recent research results seem to indicate, however, that the interface formed between the copper and dielectric cap layer is a major diffusion path for material transport during operation of the metal interconnect.

Consequently, a plurality of alternatives have been developed in an attempt to enhance the interface characteristics between the copper and the cap layer having the capability of reliably confining the copper and maintaining its integrity. For example, it has been proposed to selectively provide conductive materials on top of the copper-containing region, which may exhibit superior electromigration performance while not unduly reducing the overall resistance of the corresponding metal line. For instance, various alloys, such as a compound of cobalt/tungsten/phosphorous (CoWP), a compound of nickel/molybdenum/phosphorous (NiMoP) and the like, have proven to be promising candidates for conductive cap layers, which may significantly reduce electromigration effects within a corresponding metal line.

Although these compounds provide superior electromigration performance, the implementation of an appropriate manufacturing process flow into well-established process strategies for forming complex metallization systems is associated with significant efforts with respect to preparing the exposed surface for the corresponding electrochemical deposition process. Moreover, frequently, severe defects may be observed in metallization systems including copper lines with a conductive cap layer formed on the basis of electrochemical deposition techniques, since increased leakage currents and dielectric breakdown events may occur in such devices compared to devices having a metallization system based on a dielectric cap layer.

In other strategies, the incorporation of certain species into the copper surface has been proven to be a viable technique for enhancing the overall electromigration behavior, for instance, in combination with a corresponding cap or etch stop layer. Thus, in some conventional process regimes, the exposed surface of the copper lines may be exposed to a reactive ambient in order to incorporate silicon, nitrogen and the like for enhancing the surface characteristics of the metal lines prior to depositing the cap or etch stop material. For example, a silicon and/or nitrogen containing species may be supplied into the reactive ambient of a plasma based cleaning process in order to initiate the inter-diffusion of silicon, nitrogen and the like, thereby forming a corresponding copper compound that may significantly enhance the overall surface characteristics. For instance, silane may be used in a corresponding plasma treatment in order to form a silicon/copper compound, which may also be referred to as copper silicide and may provide the superior electromigration behavior.

Although the electromigration behavior of the copper surface may be enhanced in combination with a dielectric cap layer by initiating a silicon/nitrogen diffusion into the surface area of the copper material, it turns out, however, that the degree of inter-diffusion may be difficult to control and also the reactive plasma ambient may result in significant damage of exposed surface areas of sensitive dielectric materials, in particular when ULK materials are used in sophisticated applications. For this reason, thermo chemical treatments have been used, for instance, for cleaning the exposed copper surface and initiating a silicon diffusion into the copper surface in order to obtain the superior electromigration behavior, while avoiding or at least reducing undue damage of the sensitive dielectric materials. On the other hand, the copper/silicon compound forming in and beyond the copper surface may have a negative effect on the overall conductivity of the metal line, in particular in metallization systems requiring high current densities, due to the reduced cross-sectional area, which may result in significant signal propagation delays.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to process techniques in which a superior performance with respect to electromigration may be obtained, while at the same time the overall electrical performance of the metallization system may be enhanced. For this purpose, the material characteristics of highly sensitive low-k and ULK materials may not be unduly deteriorated, or may even be reestablished, after certain process steps on the basis of a thermo chemical treatment. It has been recognized that, for many sophisticated low-k dielectric materials, the overall behavior of these materials may critically depend on the carbon contents, which may be significantly reduced upon exposure to reactive plasma ambients, as may typically be applied during corresponding cleaning processes and frequently also during the incorporation of a silicon species into exposed surface areas. Consequently, in some illustrative aspects disclosed herein, a thermo chemical treatment may be applied which may result in a significantly reduced degree of carbon depletion upon interaction with sensitive low-k dielectric materials, while a copper-containing metal region may have formed thereon a conductive cap layer which may result in superior electromigration performance and may also act as an efficient mask during the thermo chemical treatment. Consequently, the advantage of a superior electromigration performance without sacrificing overall conductivity may be accomplished by providing the conductive cap layer, while at the same time the thermo chemical treatment may result in superior characteristics of the low-k dielectric material, wherein, in some illustrative embodiments disclosed herein, a further thermo chemical treatment may be performed on the basis of an appropriate process ambient, such as a silicon-containing ambient, which may result in a corresponding improvement of surface characteristics of the dielectric material. For example, a certain degree of etch-related damage of the sensitive low-k dielectric material may be "repaired," thereby enhancing the surface conditions for the further processing of the semiconductor device, for instance in view of depositing a further dielectric material, such as an etch stop material or any other transition material layer for forming thereon a further low-k dielectric material.

One illustrative method disclosed herein relates to forming a metallization layer for a semiconductor device. The method comprises forming a conductive cap layer on a surface of a metal region that is laterally embedded in a first dielectric material of the metallization layer. Additionally, the method comprises performing a thermo chemical cleaning treatment on an exposed surface of the first dielectric material in the presence of the conductive cap layer. Furthermore, the method comprises forming a second dielectric material on the exposed surface of the first dielectric material and the conductive cap layer.

A further illustrative method disclosed herein comprises forming a conductive cap material on a copper-containing surface of a metal region of a metallization layer of a semiconductor device, wherein the metal region is formed in a low-k dielectric material of the metallization layer. The method further comprises performing a first thermo chemical treatment on an exposed surface of the low-k dielectric material on the basis of a copper oxide reducing process gas. The method additionally comprises performing a second thermo chemical treatment on the exposed surface on the basis of a silicon-containing process ambient after performing the first thermo chemical treatment. Moreover, the method comprises forming a dielectric material layer on the conductive cap layer and the exposed surface of the low-k dielectric material.

A still further illustrative method disclosed herein relates to forming a metallization layer of a semiconductor device. The method comprises forming an opening in a low-k dielectric layer and filling the opening with a copper-containing material so as to form a metal region. Furthermore, a conductive cap layer is formed on the surface of the metal region and a cleaning process is performed on the basis of a copper-reducing gas ambient in the absence of a plasma. Additionally, the method comprises performing a surface modification process on the basis of a silicon-containing process ambient in the absence of a plasma in the silicon-containing process ambient.

BRIEF DESCRIPTION OF THE DRAWINGS

The disclosure may be understood by reference to the following description taken in conjunction with the accompanying drawings, in which like reference numerals identify like elements, and in which.

Figure 1A:
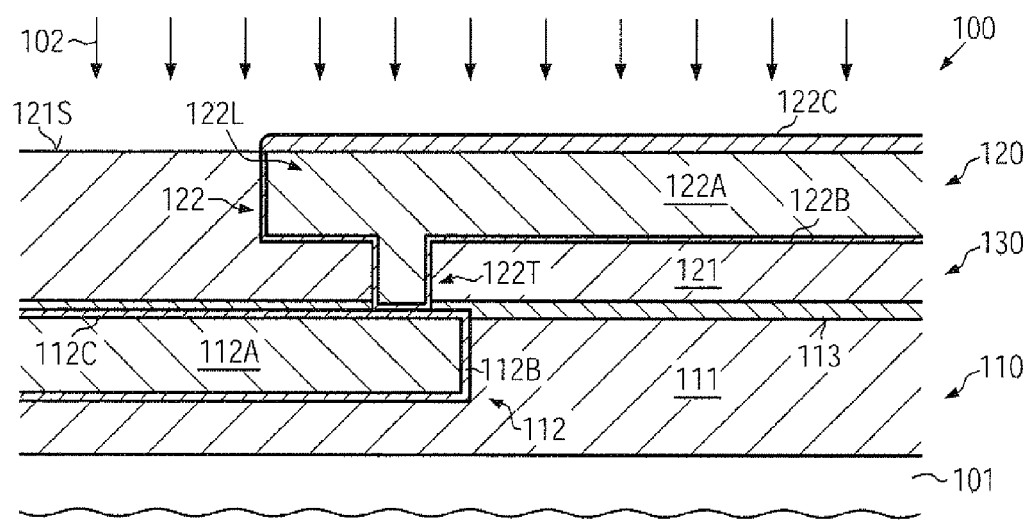
FIGS. 1a, 1b and 1d schematically illustrate cross-sectional views of a semiconductor device during various manufacturing stages in forming metallization layers in which a thermo chemical treatment may be performed on the basis of a conductive cap layer, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides process techniques in which superior electromigration characteristics may be achieved for metal regions in sophisticated metallization systems on the basis of a conductive cap material, while, additionally, undue deterioration of sensitive low-k dielectric materials, such as carbon depletion, etch-related damage and the like, may be reduced, so that overall performance of the metallization system may be enhanced due to superior electromigration with a desired high conductivity at more stable and uniform characteristics of the dielectric material, for instance in view of a higher breakdown voltage and the like. To this end, after forming the conductive cap layer selectively on an exposed metal region, at least a cleaning process may be performed as a thermo chemical treatment, which may be understood as a treatment performed in a process ambient that is established without a plasma, i.e., a high fraction of ionized particles. It should be appreciated in this respect that a thermo chemical process ambient may be understood as an ambient in which the fraction of ionized particles substantially corresponds to a fraction that would be obtained by the thermal movement of molecules and atoms according to specified pressure and temperature conditions. Thus, a higher fraction of ionized particles caused by interaction with an electromagnetic field may not be considered as a thermo chemical process ambient.

In some illustrative embodiments disclosed herein, the thermo chemical cleaning process may be performed on the basis of oxide-reducing gases, such as an ammonia gas and/or a nitrogen gas, and may result in an efficient removal of contaminants generated during the preceding processes, such as copper deposition, chemical mechanical polishing of excess materials, the deposition of the conductive cap layer and the like, while also reducing the tendency of the sensitive low-k dielectric material for out-diffusion of carbon species, which may significantly affect the overall characteristics of the low-k material. Consequently, during the further processing, for instance the deposition of a further dielectric material, which may be accomplished on the basis of an in situ process in combination with the previous thermo chemical treatment, enhanced surface conditions may be provided which may result in increased dielectric strength of the dielectric material, which in turn may contribute to a superior reliability of the resulting metallization system. In other illustrative embodiments, a further thermo treatment may be performed on the basis of the silicon-containing process ambient in which a certain degree of surface modification may be accomplished, for instance by hardening or densifying exposed surface areas of the sensitive low-k dielectric material, thereby providing further enhanced surface conditions during the further processing, or even reducing the degree of damage of previously performed etch and resist strip processes, thereby also contributing to superior reliability and thus dielectric strength. In some illustrative embodiments, the thermo chemical treatment may thus be performed as an in situ process sequence with a cleaning step and a subsequent "silicon diffusion" step, possibly in combination with a deposition process for forming a further dielectric material, such as a silicon nitride material, nitrogen-containing silicon carbide material and the like. Thus, in sophisticated metallization systems requiring even further reduced parasitic capacitance values between closely spaced metal regions, sensitive dielectric materials having a dielectric constant of 3.0 or even 2.0 and less may be used, wherein a corresponding process sequence may result in a significant degree of damaging the materials, thereby contributing to reduced reliability in terms of dielectric strength and the like. Thus, an efficient silicon diffusion into the exposed surface areas on the basis of a plasma-free treatment may thus reestablish to a certain degree the desired molecular structure or may provide enhanced hardness or density of the surface area, which may also in part enhance mechanical stability to these materials, which may frequently be provided in the form of a porous material system. For example, the degree of porosity at the exposed surface areas of these sensitive dielectric materials may be reduced by establishing a process ambient during the thermo chemical treatment on the basis of silicon-containing substances in the form of HMDS (hexamethyldisilazane) and the like. In some illustrative embodiments, the thermo chemical treatment may also be performed prior to actually forming the metal regions in the sensitive dielectric material, that is, after patterning the dielectric material and prior to forming a conductive barrier material and depositing a copper-containing metal. Also, in this case, a negative effect of plasma-based processes may be avoided while nevertheless obtaining superior surface conditions for the subsequent process steps.

FIG. 1a schematically illustrates a cross-sectional view of a semiconductor device 100 comprising a substrate 101 in and above which may be formed circuit elements, such as transistors and the like, as required by the overall circuit configuration of the device 100. As previously indicated, the continuous shrinkage of the critical feature sizes in the transistor level of the device, which may currently be at approximately 50 nm and less, also requires a corresponding adaptation of the feature sizes of metal lines and vias in a metallization system 130 of the device 100. In the embodiment shown in FIG. 1a, the metallization system 130 may be represented by a first metallization layer 110 and a second metallization layer 120. It should be appreciated, however, that the metallization system 130 may comprise any number of metallization layers as are necessary in view of the overall complexity of the device 100. For convenience, any further metallization layers which may be formed above the layer 120 or which may be positioned below the metallization layer 110 are not shown. The metallization layer 110 may comprise a dielectric material 111, such as a low-k dielectric material having a dielectric constant of 3.0 or less, while, in more sophisticated applications, the dielectric constant may be approximately 2.0 and less, in which case corresponding materials may also be referred to herein as ultra low-k (ULK) materials. Moreover, the metallization layer 110 may comprise a metal region or metal line 112 wherein it should be appreciated that, typically, a large number of appropriate metal regions may be provided in the metallization layer 110. The metal line or metal region 112 may comprise a highly conductive core material 112A based on copper, silver and the like, while a conductive barrier material 112B may confine the core materials 112A, for instance with respect to diffusion into the surrounding dielectric material and with respect to the incorporation of reactive components, such as oxygen, fluorine and the like, which may be present in the dielectric material 111. Furthermore, as previously explained, the conductive barrier material 112B may provide the desired adhesion of the core material 112A to the surrounding dielectric material 111 and may also form a strong interface with the highly conductive core material 112A in order to provide the desired electromigration behavior. For example, tantalum, tantalum nitride and the like are well-established barrier materials. Furthermore, in the embodiment shown, a conductive cap layer 112C may be formed on the core material 112A and may be comprised of any appropriate material, such as CoWP compounds and the like, as is for instance also previously explained. It should be appreciated, however, that in other illustrative embodiments (not shown), the conductive cap layer 112C may not be provided if considered appropriate for the metallization layer 110, while, however, in other metallization layers, such as the layer 120, superior electromigration behavior in combination with a high electric conductivity may be required. Furthermore, a dielectric etch stop or cap layer 113, which may be comprised of silicon carbide, nitrogen-containing silicon carbide, silicon nitride and the like, may be formed on the dielectric material 111 and on the metal region 112, for instance on the conductive cap layer 112C, while in other cases the dielectric layer 113 may provide the required copper confinement and electromigration behavior.

The metallization layer 120 may comprise a dielectric material 121, which may also represent a low-k dielectric material or a ULK material, which may have a more or less porous state, as previously explained. Furthermore, a metal region 122 may be laterally embedded in the dielectric material 121 and may comprise a core material 122A, such as a copper material, in combination with a conductive barrier material 122B. In the embodiment shown, the metal region 122 may comprise a metal line 122L and a via 122T connecting to the metal region 112 of the metallization layer 110. Furthermore, in this manufacturing stage, a conductive cap layer 122C formed of any appropriate metal or metal compound may be formed at least on the core material 122A so as to provide superior electromigration behavior while not unduly affecting the overall conductivity of the metal region 122.

The semiconductor device 100 as illustrated in FIG. 1a may be formed on the basis of the following processes. After forming corresponding circuit elements, such as transistors, in a semiconductor material provided above the substrate 101, a contact structure (not shown) may be formed on the basis of well-established process techniques in order to provide an interface between the circuit elements formed in and above the semiconductor material and the metallization system 130. Thereafter, one or more metallization layers may be formed, such as the layer 110. For this purpose, the dielectric material 111 may be deposited on the basis of any appropriate deposition technique, such as chemical vapor deposition (CVD), spin-on techniques and the like, depending on the type of material to be deposited. As previously explained, the material 111 may comprise a certain fraction of carbon species, which may significantly affect the overall material characteristics. For example, materials on the basis of silicon, carbon, hydrogen and oxygen may frequently be used in a more or less porous state, while in other cases polymer materials and the like may be used. Thereafter, the dielectric material 111 may be patterned on the basis of sophisticated lithography and etch strategies, as will also be explained with reference to the metallization layer 120. Finally, respective openings corresponding to the metal region 112 may be filled with a metal-containing material and any excess material thereof may be removed, for instance by chemical mechanical polishing (CMP) so as to provide electrically isolated metal regions in the dielectric material 111. Thereafter, the conductive cap layer 112C may be formed, if required, followed by the deposition of the dielectric layer 113. Thereafter, the dielectric material 121 may be deposited as is previously explained with reference to the material 111 and a corresponding patterning sequence may be performed so as to obtain a trench and a via opening for the metal line 122L and the via 122T, respectively. After the patterning of the dielectric material 121 on the basis of well-established etch techniques, in some illustrative embodiments (not shown), an appropriate thermo chemical treatment may be performed, as will be explained later on with reference to FIGS. 1b and 1c. Thereafter, the conductive barrier material 122B may be deposited followed by the deposition of the core 122A and the removal of any excess material thereof. Next, the device 100 may be exposed to a deposition ambient 102, which may represent an electrochemical deposition ambient or a gaseous ambient, for instance a CVD ambient, an ambient for physical vapor deposition, such as sputter deposition and the like. For example, a plurality of metal materials may be efficiently deposited on the basis of electrochemical deposition techniques, for instance electroless plating, in which an exposed surface of the core material 122A may act as a catalyst material for initiating a deposition of the material from an appropriate electrolyte solution. Consequently, a very selective material deposition may be achieved without requiring any additional patterning strategies for restricting the conductive cap layer 122C to the metal line 122L. In other cases, any other appropriate deposition regime may be used, for instance selective CVD-like deposition techniques, in which the core material 122A may have a significantly higher deposition rate compared to exposed surface areas 121S of the dielectric material 121.

Figure 1B:
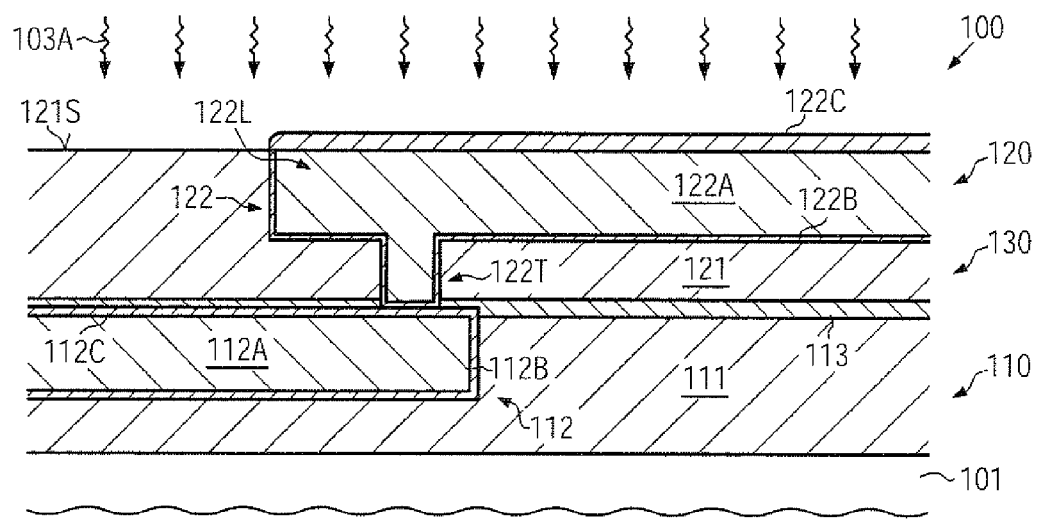

FIG. 1b schematically illustrates the semiconductor device 100 when exposed to a process ambient of a first thermo chemical treatment 103A. The process ambient of the treatment 103A may be established in any appropriate process tool, such as a deposition chamber and the like, if, for instance, a deposition of a further dielectric material may be performed as an in situ process. In one illustrative embodiment, the process ambient of the treatment 103A may be established on the basis of a copper-reducing gas, which may, for instance, be established on the basis of ammonia ($NH_3$) and nitrogen ($N_2$) at a pressure of approximately 1-6 Torr. For instance, the ratio of ammonia and nitrogen gas may range from approximately 1:400-1:1, while in other cases even substantially pure ammonia may be used as the reducing gas. Moreover, the substrate 101 may be heated to approximately 250-500° C., for instance to approximately 350° C., in order to establish a desired process temperature for the treatment 103A. Consequently, a thermally induced chemical cleaning process may be initiated at the surface of the cap layer 122C and also on the surface 121S of the dielectric material 121. As previously indicated, the treatment 103A may result in the removal of metal residues, which may have been generated during the previous process sequences, for instance the deposition of the materials 122A, 122B and the corresponding removal of any excess material thereof. Furthermore, also during the subsequent process for depositing the conductive cap layer 122C, residues may have deposited in the exposed surface 121S, which may be efficiently removed, while also reducing the degree of carbon depletion, which may typically be observed upon plasma-based cleaning processes.

Figure 1C:
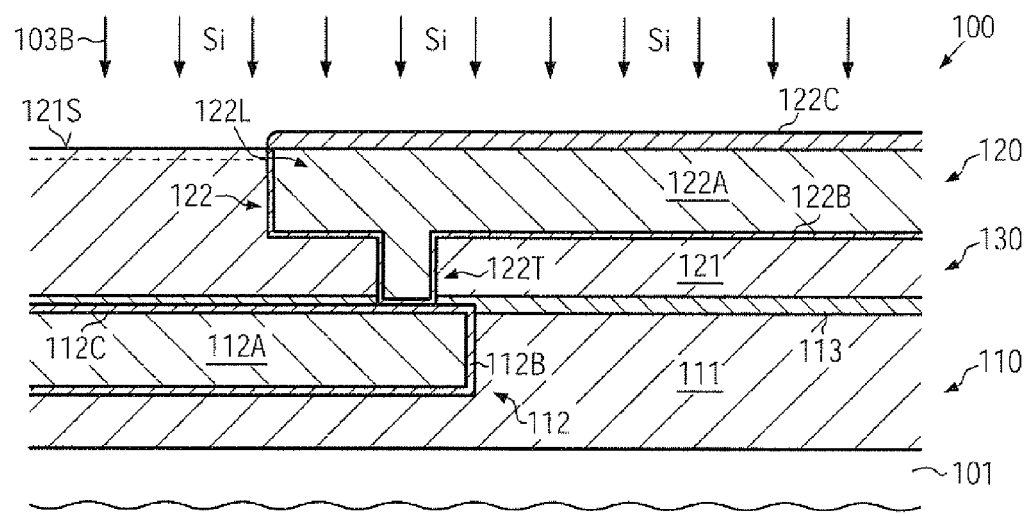
FIG. 1c schematically illustrates the semiconductor device according to a further illustrative embodiment in which an additional thermo chemical treatment may be performed so as to further enhance the characteristics of a sensitive low-k dielectric material according to further illustrative embodiments.

FIG. 1c schematically illustrates the semiconductor device 100 according to a further illustrative embodiment in which the device 100 may, in addition to the thermo chemical treatment 103A (FIG. 1b), be exposed to a further thermo chemical treatment 103B. For instance, the treatments 103A, 103B may be performed on the basis of an appropriate process ambient without exposing the device 100 to ambient atmosphere between the treatments 103A and 103B. A corresponding sequence of processes may also be referred to as an in situ process sequence, irrespective of whether the processes of the sequence may be performed in the same or different process chambers, as long as an undue exposure to ambient atmosphere may be avoided. The thermo chemical treatment 103B may be performed on the basis of a gaseous ambient including, in one illustrative embodiment, a silicon-containing gas component, such as silane or any derivatives thereof, such as tri methyl silane (3MS), tetra methyl silane (4MS), HMDS and the like. For example, on the basis of an appropriate temperature, such as 250-500° C. for silane or any derivatives thereof, a corresponding silicon diffusion into the exposed surface 121S may be initiated, thereby providing a certain degree of hardening or densification of the surface 121S. In other cases, HMDS may be used for enhancing the surface conditions of the material 121, thereby even "reestablishing" a desired structure of the surface 121S, which may have been damaged in the preceding process steps. It should be appreciated that a required degree of silicon diffusion into the surface 121S may be readily determined on the basis of corresponding test measurements in which different dielectric materials may be treated on the basis of different parameter settings for the treatment 103B and determining the surface conditions after the various treatments. Consequently, the exposed surface 121S may be modified so as to provide enhanced surface conditions during the further processing, for instance during the deposition of a further dielectric material, thereby reducing the probability of affecting the characteristics of the material 121, which may thus result in enhanced reliability, as previously explained. At the same time, the cap layer 122C may act as a protection layer so as to avoid undue silicon diffusion into the core material 122A, which may otherwise result in a reduced overall conductivity, as also previously discussed.

Figure 1D:
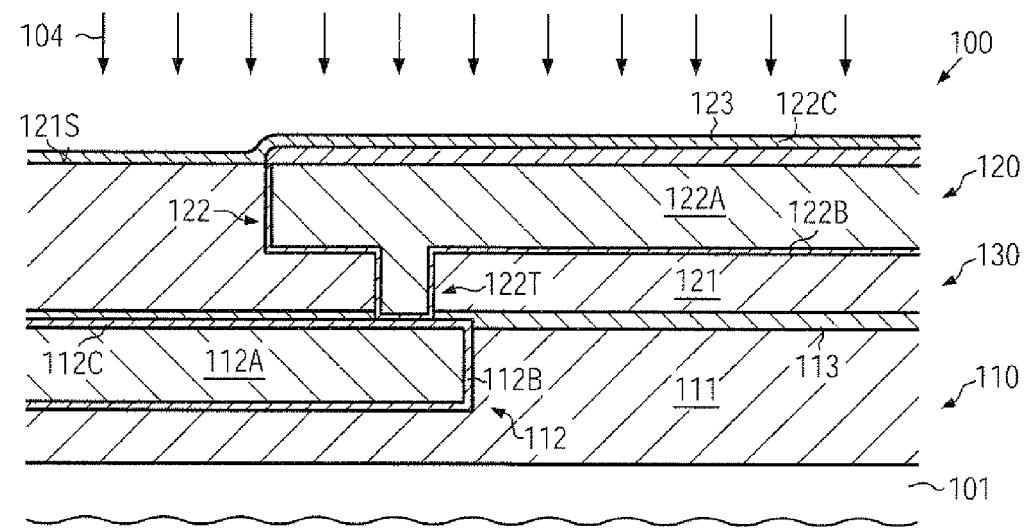

FIG. 1d schematically illustrates the semiconductor device 100 when exposed to a deposition ambient 104 after performing the treatment 103A (FIG. 1b) and, in some illustrative embodiments, also the treatment 103B (FIG. 1c). The deposition ambient 104 may be established on the basis of appropriate process parameters and precursor materials in order to obtain a desired composition of a dielectric layer 123, which may act as an etch stop material or any other appropriate transition layer for forming thereon a further dielectric material. In one illustrative embodiment, the deposition process 104 represents one process of a process sequence comprising at least the treatment 103A (FIG. 1b), wherein the process sequence may be performed as an in situ process in the above-defined sense. In other illustrative embodiments, additionally the treatment 103B (FIG. 1c) may be performed and may also represent a part of the process sequence, wherein the deposition ambient 104 may be established in the same process chamber as the process ambient of the treatment 103B. For this purpose, in some illustrative embodiments, a plasma may be established so as to initiate the deposition of silicon, nitrogen and carbon in order to form the dielectric layer 123. Thus, during the deposition of the material layer 123, the enhanced surface 121S obtained by the previous one or more of the thermo chemical treatments may result in enhanced deposition uniformity and thus stable and reliable overall characteristics, such as enhanced dielectric strength and the like. It should be appreciated that any desired material composition may be deposited during the process 104, such as two or more different material layers in the form of silicon carbide, silicon nitride, nitrogen-containing silicon carbide and the like.

Thereafter, the further processing may be continued by depositing a further dielectric material, such as a ULK material and the like, and forming therein appropriate metal lines and vias, as is also described with reference to the metallization layers 110 and 120.

In some illustrative embodiments, the thermo chemical treatments 103A, 103B, as described with reference to FIGS. 1b and 1c, respectively, may be applied as a process sequence after the patterning of the dielectric material 121, as discussed above. For example, during the patterning of the dielectric material 121, sophisticated etch strategies may have to be applied requiring formation of a resist mask, possibly in combination with hard mask material, so as to etch through the dielectric layer 121 and forming a corresponding trench for the metal line 122L (FIG. 1a). Thus, after this complex patterning sequence, the repeated exposure to a reactive ambient, such as anisotropic etch recipes, resist strip processes and the like, may result in a significant degree of damage of exposed surface portions of the dielectric material 121. In this case, applying the sequence of treatments 103A, 103B of FIGS. 1b and 1c may result in an efficient removal of contaminants and also in a corresponding "reinforcement" of exposed surface portions of the dielectric material 121. Consequently, carbon depletion during the further processing may be reduced and enhanced surface conditions may also be obtained, for instance, by hardening or densifying the exposed surface areas. Thus, upon depositing the conductive barrier material 122B, a more reliable degree of coverage may be obtained since the degree of porosity and etch damage at the surface areas of the material 121 may be significantly reduced. Furthermore, due to the avoidance of a plasma in the sequence 103A, 103B, additional damage may be avoided.

As a result, the present disclosure provides techniques in which enhanced electro-migration behavior may be accomplished on the basis of a conductive cap layer while, additionally, enhanced material characteristics of sensitive dielectric materials may be obtained by using a plasma-free cleaning process, possibly in combination with a surface modification process on the basis of, for instance, a silicon-containing process ambient.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a metallization layer of a semiconductor device, the method comprising:
    forming a conductive cap layer on a surface of a metal region, said metal region being laterally embedded in a first dielectric material of said metallization layer;
    performing a thermo chemical cleaning treatment on an exposed surface of said first dielectric material after formation of said conductive cap layer; and
    forming a second dielectric material on said exposed surface of said first dielectric material and said conductive cap layer.

2. The method of claim 1, wherein said thermo chemical cleaning treatment is performed by using oxide-reducing gases.

3. The method of claim 2, wherein said oxide-reducing gases comprises at least one of an ammonia gas and a nitrogen gas.

4. The method of claim 1, wherein said thermo chemical treatment is performed at a process temperature of approximately 250-500° C.

5. The method of claim 1, wherein said first dielectric material is a carbon-containing material having a dielectric constant of approximately 2.7 or less.

6. The method of claim 1, wherein said thermo chemical cleaning treatment and depositing of said second dielectric material are performed as a process sequence without exposing said semiconductor device to ambient atmosphere.

7. The method of claim 1, further comprising performing a second thermo chemical treatment on the basis of a silicon-containing ambient after performing said thermo chemical treatment and prior to forming said second dielectric material.

8. The method of claim 7, wherein said silicon-containing ambient is established on the basis of at least one of silane, tri-methyl silane, tetra-methyl silane and hexamethyldisilazane (HMDS).

9. The method of claim 1, wherein said metal region comprises copper and a conductive barrier material.

10. A method, comprising:
    forming a conductive cap material on a copper-containing surface of a metal region of a metallization layer of a semiconductor device, said metal region being formed in a low-k dielectric material of said metallization layer;
    performing a first thermo chemical treatment on an exposed surface of said low-k dielectric material on the basis of a copper oxide reducing process gas after formation of the conductive cap material;
    performing a second thermo chemical treatment on said exposed surface on the basis of a silicon-containing process ambient after performing said first thermo chemical treatment; and
    forming a dielectric material layer on said conductive cap layer and said exposed surface of said low-k dielectric material.

11. The method of claim 10, wherein said silicon-containing process ambient is established on the basis of at least one of silane, tri-methyl silane, tetra-methyl silane and hexamethyldisilazane (HMDS).

12. The method of claim 10, wherein said reducing process gas comprises at least one of an ammonia gas and a nitrogen gas.

13. The method of claim 10, wherein said first and second thermo chemical treatments are performed at a process temperature of approximately 250-500° C.

14. The method of claim 10, wherein said second thermo chemical treatment and forming of said dielectric material layer are performed as a continuous process sequence without exposing said semiconductor device to ambient atmosphere.

15. The method of claim 14, wherein said first thermo chemical treatment, said second thermo chemical treatment and forming of said dielectric material layer are performed as a continuous process sequence without exposing said semiconductor device to ambient atmosphere.

16. The method of claim 10, further comprising forming a trench in said low-k dielectric material and filling said trench with a copper-containing material so as to form said metal region, wherein at least one further thermo chemical treatment is performed prior to filling said trench.

17. The method of claim 16, wherein performing at least one further thermo chemical treatment comprises performing a second thermo chemical treatment on the basis of a silicon-containing process ambient.

18. A method of forming a metallization layer of a semiconductor device, the method comprising:
    forming an opening in a low-k dielectric layer;
    filling said opening with a copper-containing material so as to form a metal region;
    forming a conductive cap layer on a surface of said metal region;
    performing a cleaning process on the basis of a copper reducing gas ambient in the absence of a plasma after formation of the conductive cap layer; and
    performing a surface modification process on the basis of a silicon-containing process ambient in the absence of a plasma in said silicon-containing process ambient.

19. The method of claim 18, further comprising forming a dielectric material layer on said low-k dielectric material and said conductive cap layer.

20. The method of claim 18, wherein said low-k dielectric material comprises carbon.

* * * * *